United States Patent
Bartoli et al.

(10) Patent No.: US 6,349,059 B1
(45) Date of Patent: Feb. 19, 2002

(54) METHOD FOR READING DATA FROM A NON-VOLATILE MEMORY DEVICE WITH AUTODETECT BURST MODE READING AND CORRESPONDING READING CIRCUIT

(75) Inventors: Simone Bartoli, Cambiago; Antonio Geraci, Lercole Fridoli; Mauro Sali, Sant'Angelo Lodigiano; Lorenzo Bedarida, Vimercate, all of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/716,746

(22) Filed: Nov. 20, 2000

(30) Foreign Application Priority Data

Nov. 25, 1999 (EP) .............................................. 99830722

(51) Int. Cl.7 ............................. G11C 16/04; G11C 8/00
(52) U.S. Cl. ............................... 365/185.12; 365/238.5; 365/233

(58) Field of Search ..................... 365/185.12, 185.33, 365/233, 238.5

(56) References Cited

U.S. PATENT DOCUMENTS

| 5,696,917 A | 12/1997 | Mills et al. | ................. 395/401 |
| 5,784,705 A | 7/1998 | Leung | ......................... 711/169 |
| 5,966,724 A | 10/1999 | Ryan | .......................... 711/105 |
| 5,986,918 A | 11/1999 | Lee | ............................ 365/103 |

*Primary Examiner*—Son Mai
(74) *Attorney, Agent, or Firm*—Lisa K. Jorgenson; Allen, Dyer, Doppelt, Milbrath & Gilchrist, P.A.

(57) ABSTRACT

A method for reading data from an integrated electronic memory device including a non-volatile memory matrix includes supplying the memory with an address of a memory location where a reading is to be effected, accessing the memory matrix in a random read mode, supplying the memory with a clock signal and an address acknowledge signal (LAN), detecting a request for burst read mode access, and starting the burst reading as the clock signal shows a rising edge. A related circuit is also provided.

30 Claims, 5 Drawing Sheets

METHOD FOR READING DATA FROM A NON-VOLATILE MEMORY DEVICE WITH AUTODETECT BURST MODE READING AND CORRESPONDING READING CIRCUIT

FIELD OF THE INVENTION

This invention relates to the field of semiconductor non-volatile memories, and, more particularly, to a memory of the Flash EEPROM type. Additionally, the invention relates to a method of reading data from an integrated electronic memory device which includes at least one non-volatile memory matrix. The invention also relates to a reading circuit for an integrated electronic non-volatile memory device on a semiconductor.

BACKGROUND OF THE INVENTION

As is well known in the art, today's microprocessors and microcontrollers require data to be input at ever higher rates, exceeding the limits of conventional memory technologies. The manufacturers of semiconductor memory devices are developing progressively faster memory architectures to improve the speed of memories. One of these techniques is the synchronous burst read mode. The burst read mode allows a microprocessor to read data from a memory at a faster rate than the customary random read mode.

At first, the microprocessor supplies only the memory address to the memory. The microprocessor then delivers a clock signal and, further to a reading at a random access time, the data is delivered from the memory at each rising edge of the clock signal. The next addresses are generated internally by the memory device. The frequency of the clock signal may be much higher than that of the random read signal. Thus, the data transfer rate can be substantially increased.

Current semiconductor non-volatile memory devices can support the random read mode, which is asynchronous, as well as the burst read mode, which is synchronous. The standard read mode is, however, the random mode. Two different constructions are commonly used to enable burst reading. A first prior art solution uses a sequence of enable control signals. To operate in the burst read mode, the memory device is provided with three additional control pins. These control pins may be used to interface a wide range of microprocessors. The control pins are generally designated LBA (Load Burst Address), BAA (Burst Address Advance), and CLK (Clock).

The burst read mode includes an addressing step and a corresponding data step. During the addressing step, the pin LBA must be held low for one clock period. On the rising edge of the clock signal, the starting address of the burst mode is loaded into an internal counter of an address bus. During the data step, the first available data of the burst mode becomes accessible an access time $t_{ACC}$ after the rising edge of the clock signal. For the next data, the signal at the pin BAA is activated, and the rising edge of the clock signal at the pin CLK will increase the count in the counter and supply the remaining data in the appropriate sequence within the specific access time $t_{BACC}$. The data sequence is supplied through the duration of the signal at the pin BAA.

A graph of some signals of a memory device operated in the burst read mode previously described plotted against a common time base is shown in FIG. 1. This first approach has a drawback in that once the memory has entered the burst read mode, only this mode is permitted. Thus, to return to the random read mode, another control sequence must be provided or the configuration register re-initialized.

A second prior approach includes writing into a configuration register incorporated into the memory device. This approach is described in U.S. Pat. No. 5,903,496, for example. This second approach is even more elaborate than the first, since the burst order, the clock signal frequency, and the burst length are fixed. Thus, to change any of these values, the configuration register must be re-written.

SUMMARY OF THE INVENTION

An object of the present invention is to implement read operations in the burst mode and involving no specific control sequences or register writing steps.

Another object of the present invention is to provide a non-volatile memory device with such structural and functional features to allow read operations in the burst mode with auto-sensing features.

Yet another object of the invention is to allow read operations in the auto-sensing burst mode to be carried out with no depth limits, and thereby to obtain a substantially continuous burst.

The concept behind this invention is to supply the memory with a clock signal at the same time a pulse is imposed on a signal to acknowledge the presence of an address to be read so that the pulse will encompass at least one rising edge of the clock signal. In this way, the starting read address will be the valid one at the time when the acknowledge pulse is received.

According to the invention, a method of reading data from an electronic integrated memory device including at least one non-volatile memory matrix includes supplying the memory device with an address of a memory location from which a reading is to be taken, accessing the memory matrix in a random read mode, supplying the memory device with a clock signal and an address acknowledge signal, detecting a request for read accessing in a burst mode, and starting a burst reading responsive to a rising edge of the clock signal. More specifically, the burst reading may include reading plural memory words in parallel during a single period of the clock signal. The plural memory words may be addressed sequentially to be output from the memory device, and a new reading may be performed at a next address of a memory location during a time required to output the plural memory words. An address of the memory location may be registered at a rising edge of the address acknowledge signal. Furthermore, the address of the memory location is updated automatically for a next reading.

A read control circuit according to the present invention for a semiconductor-integrated electronic memory device including a non-volatile memory matrix is also provided. The read control circuit may include a row decoder connected to the memory matrix, a column decoder connected to the memory matrix, an address counter having respective outputs connected to the row decoder and the column decoder, and an address transition detect circuit for detecting an input transaction during an accessing step of the memory device. A plurality of read amplifiers may be connected to the column decoder and a plurality of registers may be associated with the plurality of read amplifiers for outputting data read from the memory matrix. Furthermore, the read control circuit may include a detection circuit receiving a clock signal and a burst read mode enable logic signal, a burst read mode control logic circuit connected to an output of the detection circuit, and a control logic circuit connected to an output of the address transition detect circuit and connected to the burst read mode control logic circuit. The control logic circuit may control random accessing of the memory matrix and be activated for reading from a memory address upon receiving a rising edge of the clock signal.

BRIEF DESCRIPTION OF THE DRAWINGS

The features and advantages of the method and the related circuit according to the invention will become apparent from the following description of embodiments thereof, given by way of non-limitative examples, with reference to the accompanying drawings, in which.

DETAILED DESCRIPTION OF THE PREFERRED EMBODIMENTS

Figure 3:
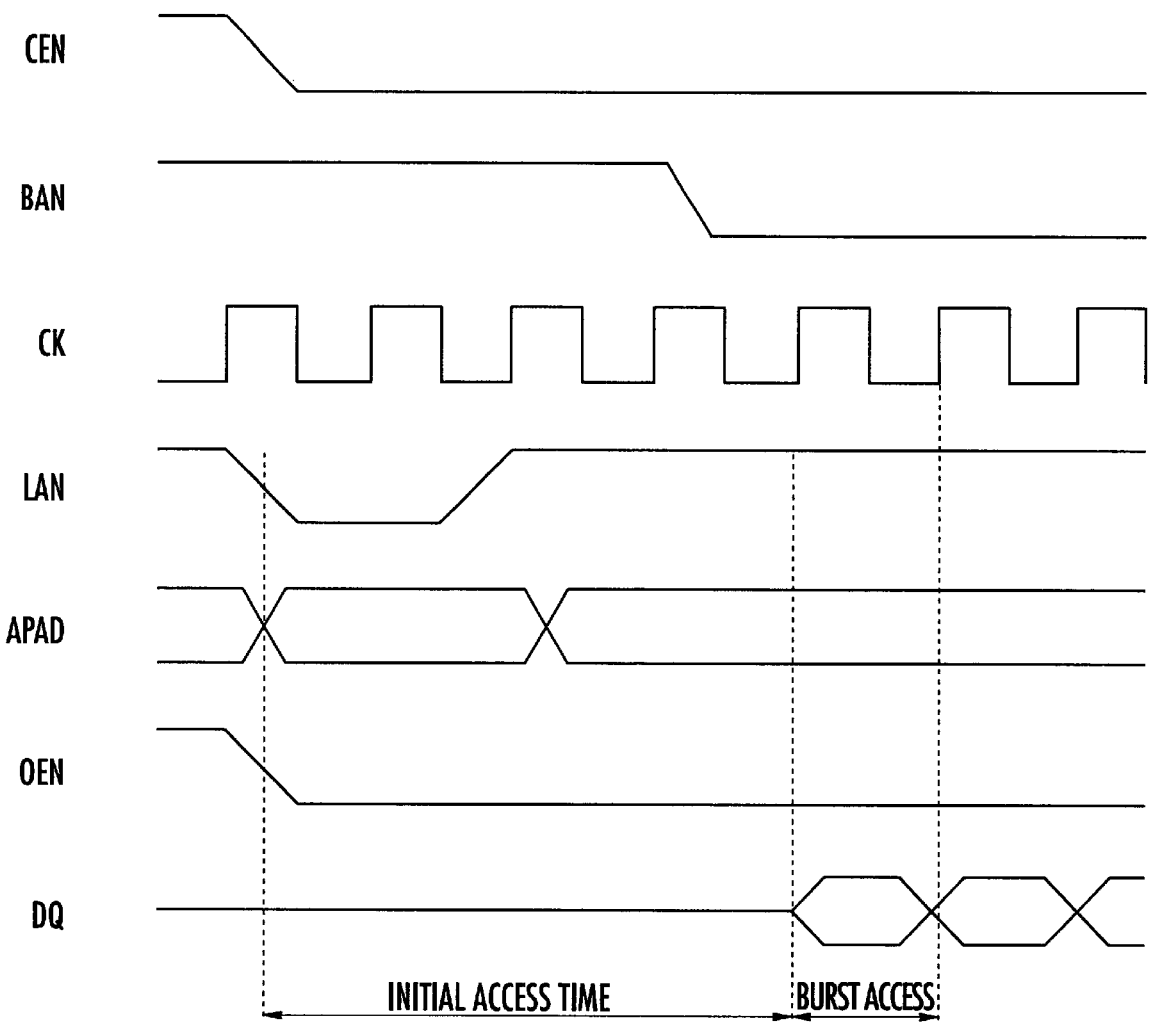
FIG. 3 is a timing diagram showing control signals plotted against a common time base as they appear in a memory device equipped with a read circuit carrying out a burst read operation according to the present invention.
Figure 4:
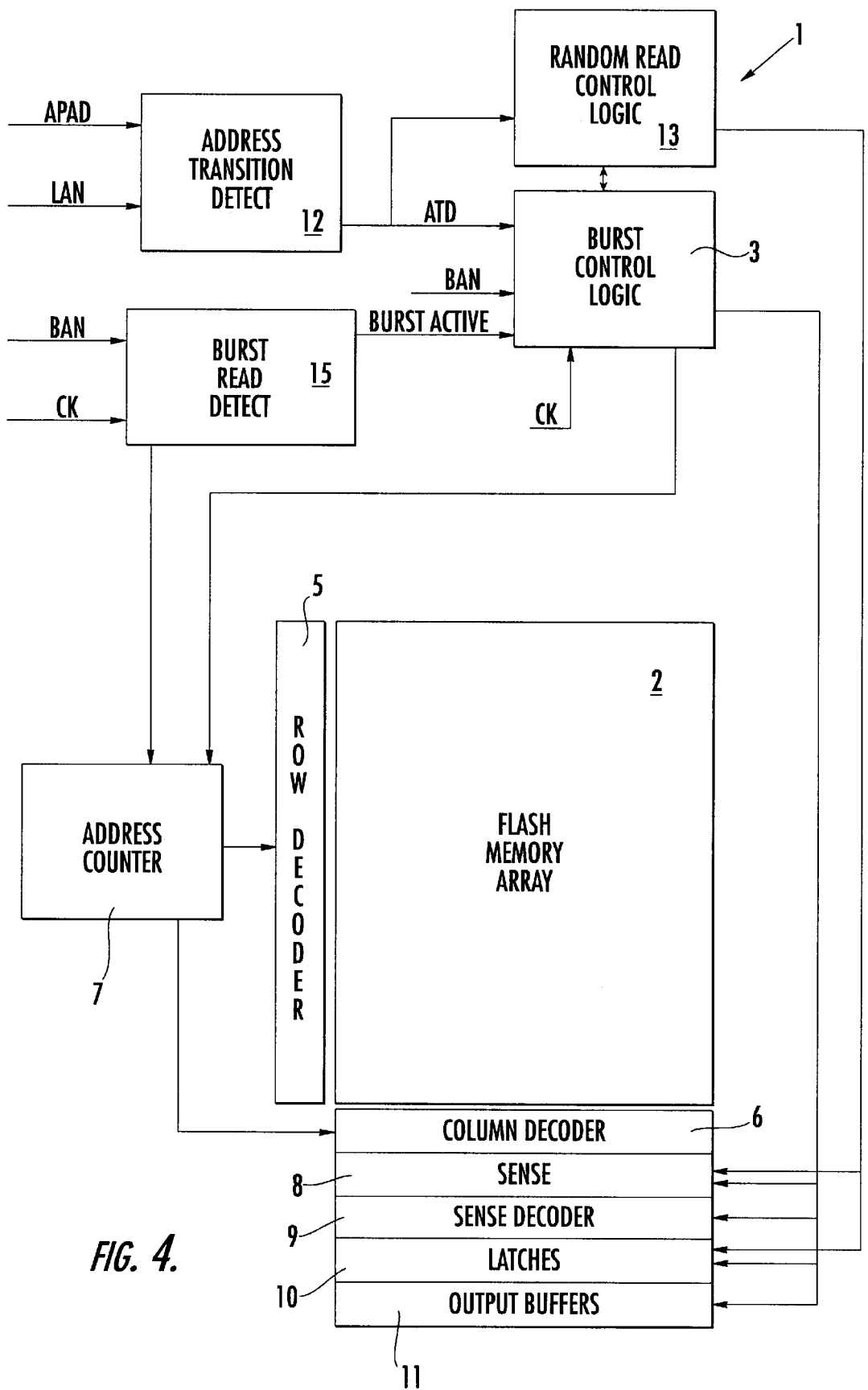
FIG. 4 is a schematic diagram of a read circuit according to the invention for a non-volatile memory device.
Figure 5:
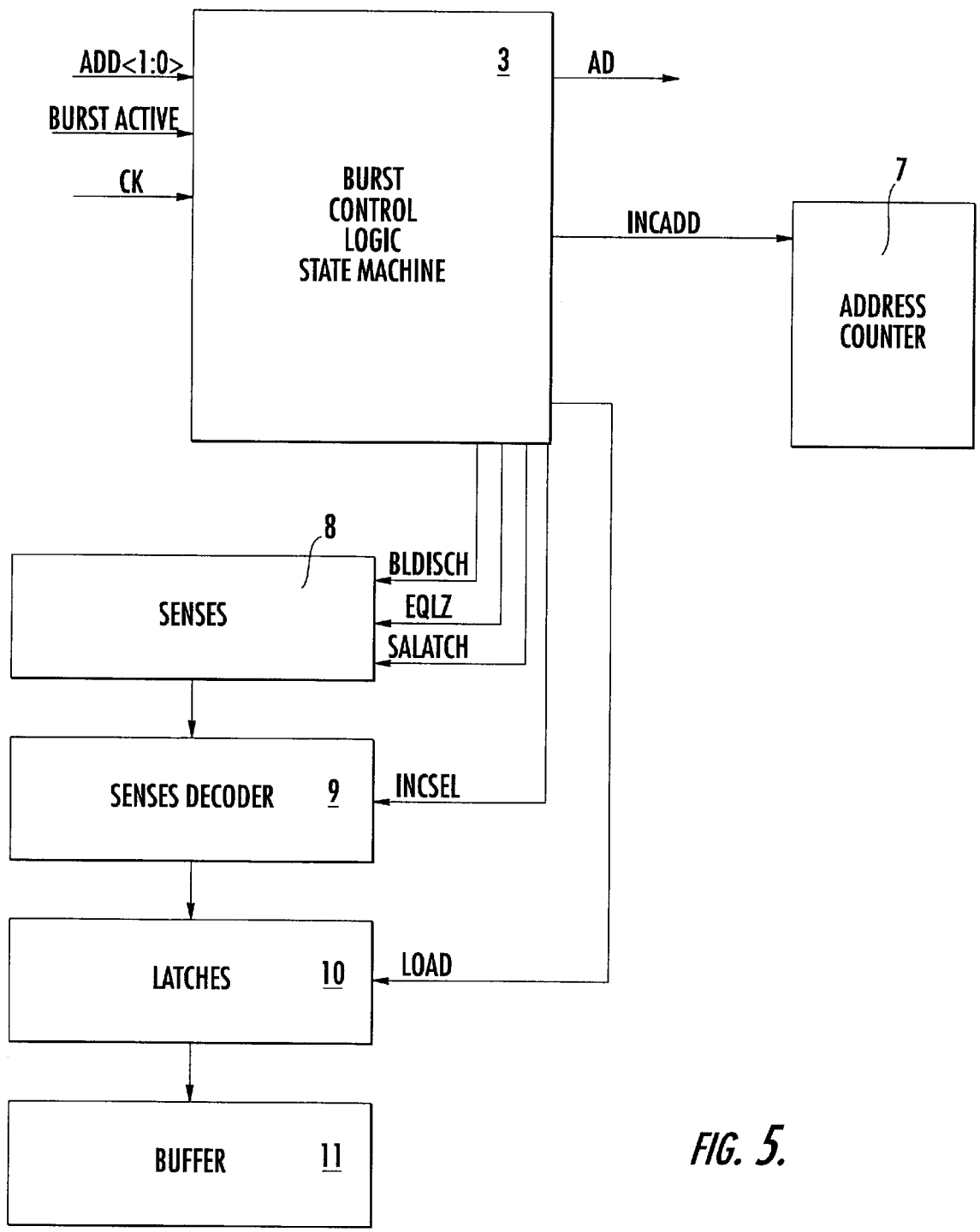
FIG. 5 is a schematic diagram showing the burst control logic and associated circuitry of FIG. 4.

Referring now to FIGS. 3–5, a read circuit portion 1 according to the present invention for a semiconductor integrated non-volatile memory device 2 is first described. The memory 2 is connected to a microprocessor or a microcontroller and may be a memory integrated with the microprocessor in a single integrated circuit chip. The construction of the read circuit portion 1 will now be described. A specific burst read mode will also be described later herein. The burst read mode to be described has some advantages in association with the read method of this invention. However, it should be noted that this invention particularly relates to methodology for automatically detecting the need to effect burst reading. Accordingly, the way in which the burst reading is carried out should not be construed to limit the principles of the present invention. In other words, once the need for burst reading is detected, the read mode itself may be executed as any conventional burst read mode. The memory device 2 is, therefore, a non-volatile memory, such as a semiconductor Flash EEPROM incorporating a memory matrix 4 and corresponding row 5 and column 6 decoders.

An address counter 7 has outputs connected to both the row decoder 5 and the column decoder 6. By a conventional series of read amplifiers 8, read decoders 9, latch registers 10, and output buffer stages 11, the data can be supplied outside the memory device 2. For implementing the burst read mode of the invention, three control pins or inputs are added to the memory device 2. Specifically, a first pin receives a clock signal, a second pin LAN (Latch Address) receives a valid address signal, and a third pin BAN (Burst Address Advance) receives a burst address advance command. The same acronyms will be used hereinafter to designate the pins and the corresponding electric signals received thereon.

The circuit portion 1 includes a burst read control logic 3 into which a signal ATD, the signal BAN, a signal BURST ACTIVE indicating an active burst read mode, and a clock signal CK are input. The control logic 3 is basically a state machine where the internal clock corresponds to the external clock signal CK as filtered through the signal BURST ACTIVE generated from a block 15 (described further below). Advantageously, the control logic 3 has a first output AD for outputting a data wait signal directed to the microprocessor and a second output 14 connected to the internal address counter 7 of the memory device. To generate the signal AD, the two least significant addresses must also be input into the control logic 3. This feature is highlighted by the inputs A<1:0>, as seen in FIG. 5.

The address counter 7 stores up the initial address and the following increments are controlled by the signal incadd. The control logic 3 is also connected to the aforementioned components 8, 9, 10 and 11. The control logic 3 is connected bidirectionally to a control logic 13 for random reading, which is input directly the signal ATD alone. The signal ATD is supplied conventionally from a circuit 12 receiving a first signal APAD and the signal LAN received on the pin LAN. The first signal APAD is generated (i.e. brought to a high logic value) upon a state transition occurring at one of the addressing terminals. The control logic 13 is further connected to the aforementioned components 8 and 10.

The first read step is always of a random type and is handled by the control logic 13. It is only at the end of the first internal reading that the two (random or burst) read modes can be differentiated. According to the invention, the circuit portion 1 is advantageously equipped with a burst mode detection circuit 15 to automatically detect the need for a burst type of reading. The clock signal CK and the signal BAN (from the pin of the same name) are input into the circuit 15. The circuit block 15 cooperates with the circuit block 12 in recognizing the moment that an internal reading sequence is to be started, and also in recognizing whether the reading is to be of a random or a burst type.

In the method of this invention, the read cycle can be split in two steps, namely a first read address registering step and a second data picking up step. During the first step, the addresses of the memory locations from which the reading should be effected are registered upon the rising edge of the signal LAN. During the data picking-up step, the memory outputs the data upon the signal OE (Output Enable) being brought to a low logic value. The difference between a random read operation and a burst read operation is established by the presence of the clock signal CK.

Figure 1:
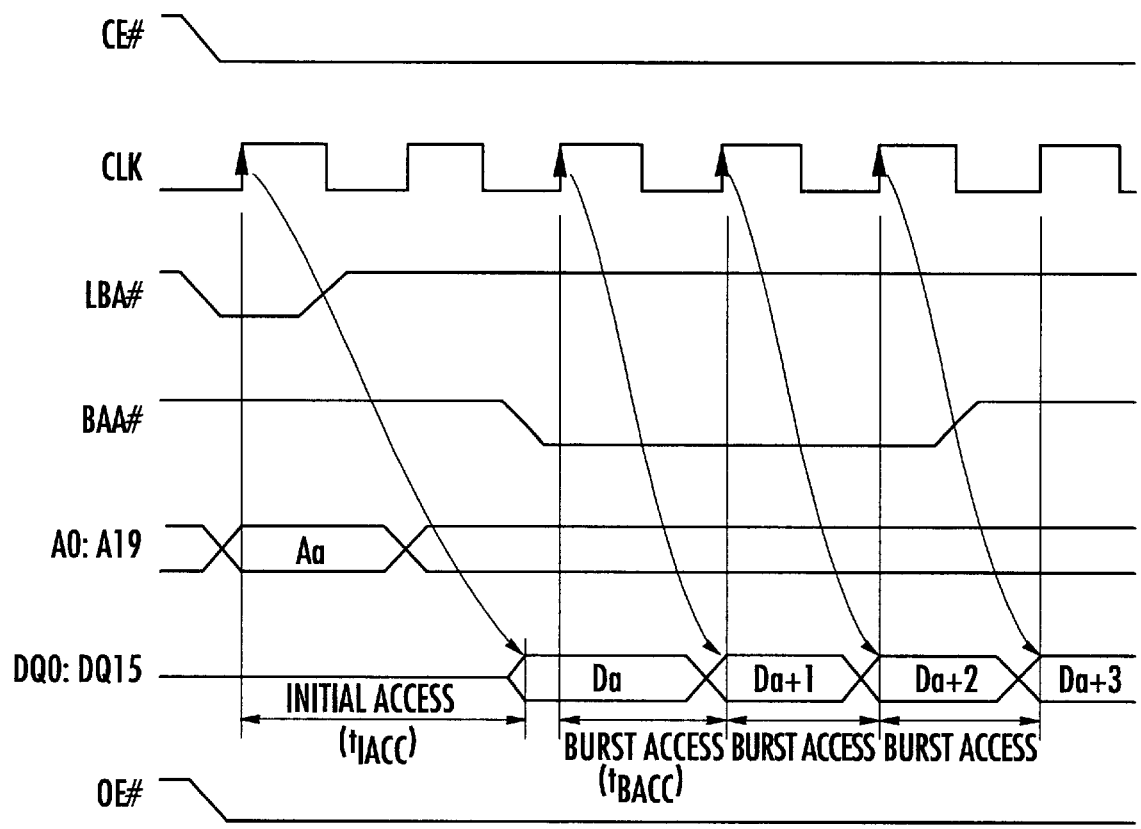
FIG. 1 is a timing diagram showing control signals plotted against a common time base as they appear in a prior art memory device being operated in a conventional burst read mode.
Figure 2:
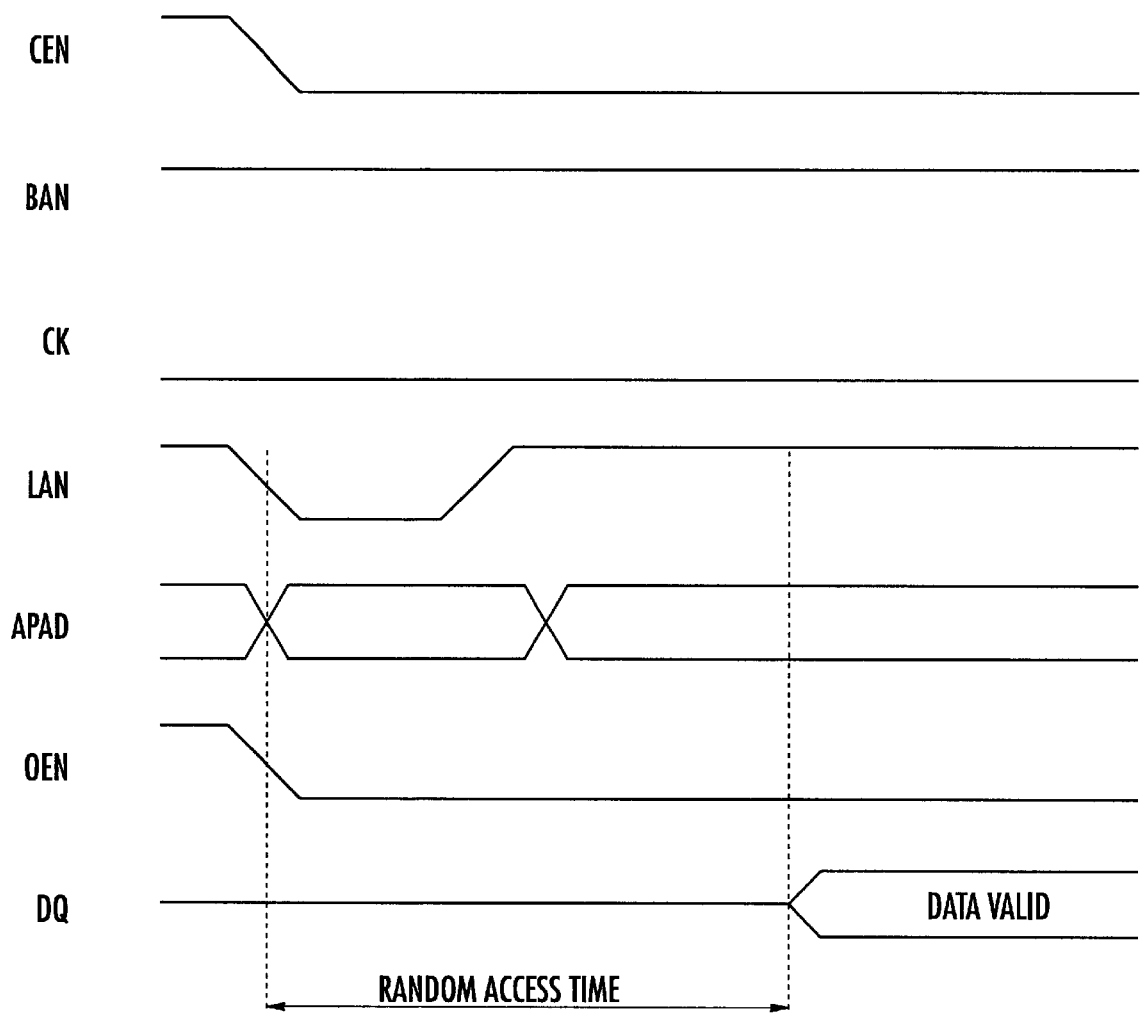
FIG. 2 is a timing diagram showing control signals plotted against a common time base as they appear in a prior art memory device during a random read mode step.

According to the method of the invention, for carrying out a burst read operation the clock signal must be supplied to the memory 2 at the same time a pulse is imposed on the signal LAN so that the latter will include at least one rising edge of the clock signal. The read starting address will be valid one at the time of the pulse LAN. FIGS. 2 and 3 show the timing of the memory control signals during the random and the burst reading, respectively. Burst reading begins as the signal CK presents a rising edge and, simultaneously therewith, the signal LAN is at a logic low value. The output of the detection circuit block 15 is brought to a high logic value when the clock signal CK goes up and the signal LAN is low.

The burst read starting address is registered on the occurrence of the rising edge of the signal LAN and is loaded into the address counter 7. After a random access time lapse, the signal BAN is brought to a low logic value, indicating to the memory 2 that the burst mode reading has begun. From then on, the memory 2 will supply a single datum at each rising edge of the clock signal CK.

The signal BAN controls the burst output of the memory. The second data of the burst read operation is issued at the next rising edge of the clock signal after the signal BAN is brought to a low logic value, as shown in FIG. 3. The address counter 7 is increased automatically by the control logic 3 after the signal BAN is brought to a low logic value. A subsequent addressing step terminates the current burst read operation. In fact, the information for determining whether the reading is to be a random or a burst type should be detected at once. This is so that for a random type the read amplifiers 8 can be turned off directly after the reading step, and for a burst type so that the memory can be made ready for a second reading as soon as a signal BAN having a low logic value is received.

The address increment may be handled within the memory. During addressing of the memory, some particular situations may be encountered when the internal reading needs more time to complete the read operation, or when the data read cannot be fully utilized. As a result, the control logic 3 is operated to bring the signal at the output AD to a high so that the rate of the clock CK can be maintained. Thus, the microprocessor is told that the data being presented at the memory output is invalid. The signal AD will only be returned to a logic low after the reading has been synchronized automatically.

FIG. 3 shows the timing for the read and control signals present in the memory 2 during the burst mode reading step. To best appreciate the aspects of the invention, it should be considered that the time necessary for an internal reading of the memory device far exceeds the period of the clock signal CK. Accordingly, a reading synchronized to the clock signal can only be obtained by providing the burst read mode with some particular features.

The burst read operation is actually carried out in parallel and in a pipelined form. That is, rather than reading one memory word at a time, several words are read internally in parallel. Following a first reading in the random mode, i.e., a reading which takes the same time as a random access, a number of read words in the burst mode become available for presentation at the memory outputs. The time taken to output the memory words serially is utilized to carry out a new reading at the next address. In this way, a higher read rate can be achieved than with random reading, at the expense of a small increase in circuit complexity and, therefore, in semiconductor area. But the benefit to be derived more than makes up for the disadvantage of the increased space requirement.

In the unusual instance where the user drives the control signals incorrectly and the memory lacks sufficient information to decide whether the reading requested should be of the random or the burst type (e.g., in the event of the high state of the signal LAN being prolonged), the memory would automatically settle for a burst type of operation. At the end of the first internal reading of the random type, the control logic 13 increases the address of the memory location for the next reading and checks the output buffer stages. This is because the circuitry synchronization to the clock signal CK, and hence the activation of the control logic 3, only takes place as the signal BAN is brought to a low logic value. To make the best use of the time lapse between the end of the first random reading and the instant the synchronous circuitry is activated, the control logic 13 is put in charge of making ready for a second reading. It should be noted that the access time of the first reading, being of a random type, is unrelated to the clock rate.

As the control logic 3 takes over in the read operation handling, it also sets the address counter 7, read amplifiers 8, latches 10, and output buffers 11. The burst read mode will be stopped by a rise occurring in the signal "chip enable" by a new pulse in the signal LAN, or by a rise in the signal BAN. Since the memory words are read in parallel in the burst mode, they need to be addressed sequentially to the output. If the initial address is not aligned to the lowest address thereof, the control logic 3 will issue the signal AD to re-align the reading.

The timing signals of the read amplifiers 8 are designated "bldisch" and "eqlz," as shown in FIG. 5. During the random reading step, both signals are controlled by convention analog circuitry which is not shown. A signal "salatch" is used for controlling the latch registers 10 of the read amplifiers 8. These registers 10 represent, in combination with those provided in the output stages 11, a pipeline structure. In fact, they allow the data of one reading to be retained until the time it is presented at the output, while the read amplifiers 8 are being used for a subsequent reading.

The decode portion 9 of the read amplifiers includes a multiplexer and a counter which is controlled from the state machine incorporated into the control logic 3. Using a signal "incsel," the control logic 3 causes the memory words that have been read in parallel to become serialized. The latch registers incorporated into the output stages 11 allow the output data to be stored for one clock period before the rising edge of the clock signal for which the output stage should be active. Thus, the time taken to transfer data from the read amplifiers to the output stages can be made much shorter.

The circuit and method of the invention solve the above-referenced technical problem and offer a number of advantages. Foremost among these advantages is the fact that the memory device can execute a random or burst read operation without being delivered a specific sequence of control instructions and without writing into an internal register. Its single requirement is that the clock pulse CK be detected at the addressing step. Furthermore, in the burst read mode, the rate of access to the memory can be modified because the first reading is always carried out in the random mode and is independent of the frequency of the clock signal. Additionally, the synchronous burst read mode is provided by the memory device in a fully automated manner and is not limited by the number of memory words which follow the access starting address.

That which is claimed is:

1. A method of reading data from an electronic integrated memory device, the method comprising:
   supplying the memory device with an address of a memory location from which a reading is to be taken;
   accessing the memory device in a random read mode;
   supplying the memory device with a clock signal and an address acknowledge signal;
   detecting a request for read accessing in a burst mode; and
   starting a burst reading responsive to a rising edge of the clock signal.

2. A method according to claim 1 wherein the burst reading comprises reading plural memory words in parallel during a single period of the clock signal.

3. A method according to claim 2 wherein the plural memory words are addressed sequentially to be output from the memory device; and wherein the method further comprises performing a new reading at a next address of a memory location during a time required to output the plural memory words.

4. A method according to claim 1 wherein the address of the memory location is registered at a rising edge of the address acknowledge signal.

5. A method according to claim 1 wherein the address of the memory location is updated automatically for a next reading.

6. A method of reading data from a memory device comprising:
supplying the memory device with an address of a memory location from which a reading is to be taken;
accessing the memory device in a random read mode;
supplying the memory device with a clock signal and an address acknowledge signal;
detecting a request for read accessing in a burst mode; and
starting a burst reading responsive to a rising edge of the clock signal.

7. A method according to claim 6 wherein starting comprises starting the burst reading by reading plural memory words in parallel during a single period of the clock signal.

8. A method according to claim 7 wherein the plural memory words are addressed sequentially to be output from the memory device; and wherein the method further comprises performing a new reading at a next address of a memory location during a time required to output the plural memory words.

9. A method according to claim 6 wherein the address of the memory location is registered at a rising edge of the address acknowledge signal.

10. A method according to claim 6 wherein the address of the memory location is updated automatically for a next reading.

11. A read control circuit for a semiconductor-integrated electronic memory device comprising a non-volatile memory matrix, the read control circuit comprising:
a row decoder connected to the memory matrix;
a column decoder connected to the memory matrix;
an address counter having respective outputs connected to the row decoder and the column decoder;
an address transition detect circuit for detecting an input transaction during an accessing step of the memory device;
a plurality of read amplifiers connected to said column decoder;
a plurality of registers associated with said plurality of read amplifiers for outputting data read from the memory matrix;
a detection circuit receiving a clock signal and a burst read mode enable logic signal;
a burst read mode control logic circuit bidirectionally connected to an output of said detection circuit; and
a control logic circuit connected to an output of said address transition detect circuit and bidirectionally connected to said burst read mode control logic circuit for controlling random accessing of the memory matrix, said control logic circuit being activated for reading from a memory address upon receiving a rising edge of the clock signal.

12. A read control circuit according to claim 11 wherein said burst read mode control logic circuit causes a plurality of memory words to be read in parallel in a single period of the clock signal during a burst read mode.

13. A read control circuit according to claim 12 wherein the plurality of memory words are addressed sequentially to be output from said plurality of registers; and wherein a new reading at a next memory address is performed during a time required to output the plurality of memory words.

14. A read control circuit according to claim 11 wherein said detection circuit and said control logic circuit have respective outputs connected to said address counter.

15. A read control circuit according to claim 11 wherein said control logic circuit outputs a wait logic signal when a time for completing a read operation exceeds a period of the clock signal or when the data read from the memory matrix cannot be used.

16. A read control circuit according to claim 11 wherein said control logic circuit comprises a state machine.

17. A read control circuit for a memory device comprising a non-volatile memory matrix, the read control circuit comprising:
a detection circuit receiving a clock signal and a burst read mode enable logic signal;
a burst read mode control logic circuit connected to an output of said detection circuit;
an address transition detect circuit for detecting an input transaction during an accessing step of the memory device; and
a control logic circuit connected to an output of said address transition detect circuit and connected to said burst read mode control logic circuit for controlling random accessing of the memory matrix, said control logic circuit being activated for reading from a memory address upon receiving a rising edge of the clock signal.

18. A read control circuit according to claim 17 wherein said burst read mode control logic causes a plurality of memory words to be read in parallel in a period of the clock signal during a burst read mode.

19. A read control circuit according to claim 18 wherein the plurality of memory words are addressed sequentially; and wherein a new reading at a next memory address is performed during a time required to output the plurality of memory words.

20. A read control circuit according to claim 17 further comprising an address counter connected to respective outputs of said detection circuit and said control logic circuit.

21. A read control circuit according to claim 17 wherein said control logic circuit outputs a wait logic signal when a time for completing a read operation exceeds a period of the clock signal or when the data read from the memory matrix cannot be used.

22. A read control circuit according to claim 17 wherein said control logic circuit comprises a state machine.

23. A read control circuit according to claim 17 wherein said control logic circuit is bidirectionally connected to said burst read mode control logic circuit.

24. A memory device comprising:
a memory matrix of non-volatile cells;
a detection circuit receiving a clock signal and a burst read mode enable logic signal;
a burst read mode control logic circuit connected to an output of said detection circuit;
an address transition detect circuit for detecting an input transaction during an accessing step of said memory matrix; and
a control logic circuit connected to an output of said address transition detect circuit and connected to said burst read mode control logic circuit for controlling random accessing of said memory matrix, said control logic circuit being activated for reading from a memory address upon receiving a rising edge of the clock signal.

25. A read control circuit according to claim 24 wherein said burst read mode control logic causes a plurality of memory words to be read in parallel in a period of the clock signal during a burst read mode.

26. A read control circuit according to claim 25 wherein the plurality of memory words are addressed sequentially; and wherein a new reading at a next memory address is performed during a time required to output the plurality of memory words.

27. A read control circuit according to claim 25 further comprising an address counter connected to respective outputs of said detection circuit and said control logic circuit.

28. A read control circuit according to claim 25 wherein said control logic circuit outputs a wait logic signal when a time for completing a read operation exceeds a period of the clock signal or when the data read from said memory matrix cannot be used.

29. A read control circuit according to claim 25 wherein said control logic circuit comprises a state machine.

30. A read control circuit according to claim 25 wherein said control logic circuit is bidirectionally connected to said burst read mode control logic circuit.

* * * * *

UNITED STATES PATENT AND TRADEMARK OFFICE
CERTIFICATE OF CORRECTION

PATENT NO.   : 6,349,059 B1
DATED        : February 19, 2002
INVENTOR(S)  : Simone Bartoli, Antonio Geraci, Mauro Sali and Lorenzo Bedarida It is certified that error appears in the above-identified patent and that said Letters Patent is hereby corrected as shown below:

Title page,
Item [73], Assignee, delete "STMicroelectronics S.R.L." insert
-- STMicroelectronics S.r.l. --

Column 9,
Lines 1 and 4, delete "25" insert -- 24 --

Column 10,
Lines 1 and 3, delete "25" insert -- 24 --

Signed and Sealed this

Fifteenth Day of October, 2002

Attest:

JAMES E. ROGAN
Director of the United States Patent and Trademark Office

Attesting Officer